United States Patent
Sakabe et al.

(10) Patent No.: US 10,818,809 B2
(45) Date of Patent: Oct. 27, 2020

(54) SOLAR CELL MODULE

(71) Applicants: TOYOTA JIDOSHA KABUSHIKI KAISHA, Toyota-shi (JP); KABUSHIKI KAISHA TOYOTA JIDOSHOKKI, Kariya-shi (JP)

(72) Inventors: Motoya Sakabe, Nisshin (JP); Kazuyoshi Ogata, Toyota (JP); Hirotaka Inaba, Kariya (JP)

(73) Assignees: TOYOTA JIDOSHA KABUSHIKI KAISHA, Toyota-shi (JP); KABUSHIKI KAISHA TOYOTA JIDOSHOKKI, Kariya-shi (JP)

( * ) Notice: Subject to any disclaimer, the term of this patent is extended or adjusted under 35 U.S.C. 154(b) by 0 days.

(21) Appl. No.: 16/184,277

(22) Filed: Nov. 8, 2018

(65) Prior Publication Data
US 2019/0189821 A1    Jun. 20, 2019

(30) Foreign Application Priority Data
Dec. 20, 2017   (JP) .................. 2017-244450

(51) Int. Cl.
*H01L 31/048*  (2014.01)
*B60K 16/00*   (2020.01)
*B62D 25/06*   (2006.01)
*H02S 20/23*   (2014.01)
*H01L 33/52*   (2010.01)

(52) U.S. Cl.
CPC .......... *H01L 31/048* (2013.01); *B60K 16/00* (2013.01); *B62D 25/06* (2013.01); *B60K 2016/003* (2013.01)

(58) Field of Classification Search
CPC ....... H01L 31/048; H01L 33/52; H02S 20/23; H02S 20/30; B62D 25/06; B60K 2016/003
See application file for complete search history.

(56) References Cited

U.S. PATENT DOCUMENTS

| | | | |
|---|---|---|---|
| 2002/0008412 A1* | 1/2002 | Patz | B62D 25/06 296/211 |
| 2007/0125417 A1* | 6/2007 | Johanson | H01M 10/465 136/244 |
| 2013/0092457 A1* | 4/2013 | Wecker | B60L 8/00 180/2.2 |
| 2015/0239342 A1* | 8/2015 | Kimura | B60K 16/00 296/215 |
| 2019/0047480 A1* | 2/2019 | Espig | B60R 9/055 |
| 2019/0363205 A1* | 11/2019 | Ming | H01L 31/18 |

FOREIGN PATENT DOCUMENTS

JP    2012-232679    11/2012

* cited by examiner

*Primary Examiner* — Susan D Leong
(74) *Attorney, Agent, or Firm* — Oblon, McClelland, Maier & Neustadt, L.L.P.

(57) ABSTRACT

A solar cell module includes: a sealing layer in which power generating elements are sealed; a front surface layer formed from resin and joined to a light-receiving surface side of the power generating elements in the sealing layer; and a rear surface layer joined to an opposite side from the light-receiving surface side of the power generating elements in the sealing layer, wherein the front surface layer has a solar cell installation area that forms a portion of a solar cell, and an antenna installation area that extends at a vehicle front side or a vehicle rear side of the solar cell installation area.

4 Claims, 4 Drawing Sheets

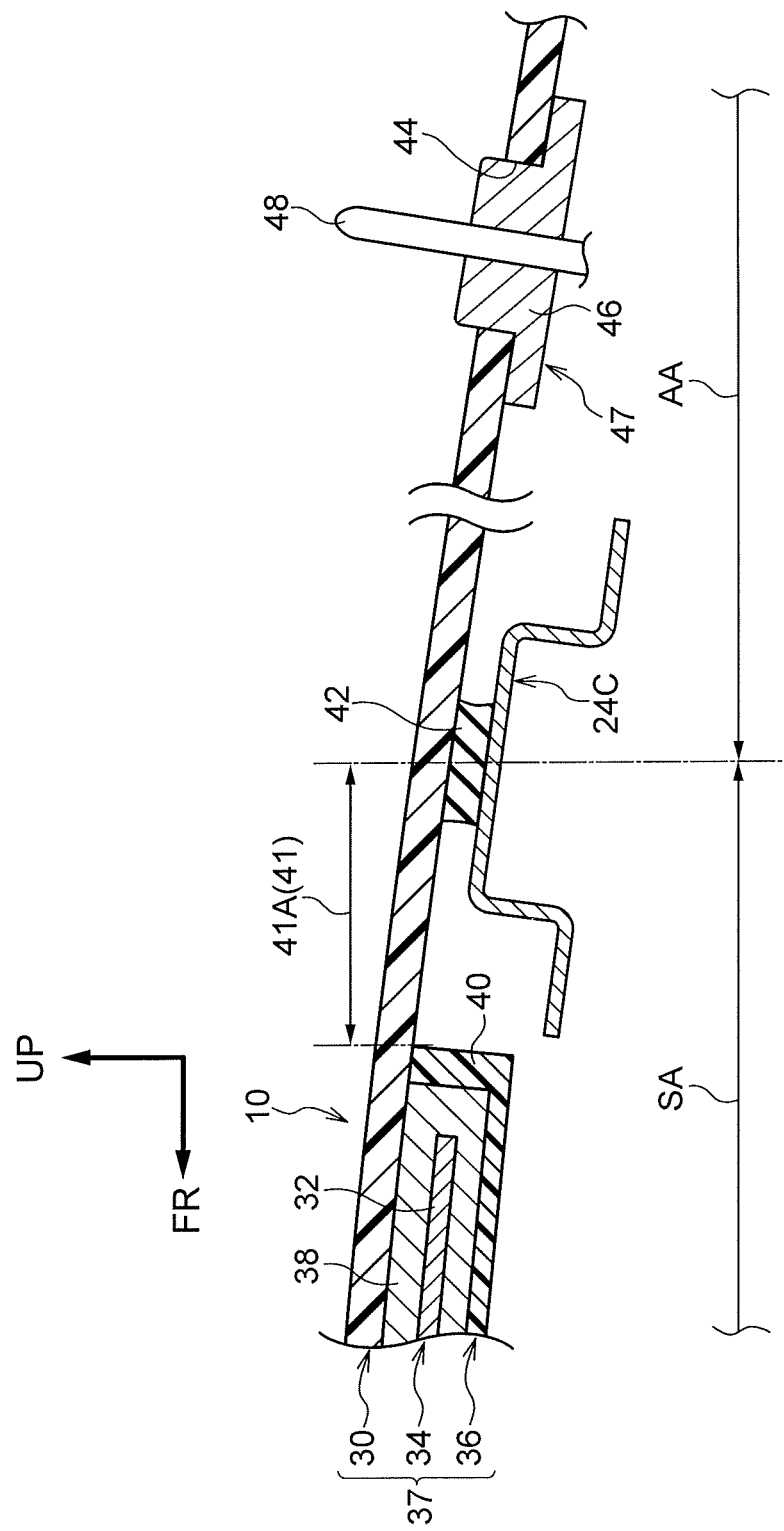

SOLAR CELL MODULE

CROSS-REFERENCE TO RELATED APPLICATION

This application claims priority under 35 USC 119 from Japanese Patent Application No. 2017-244450 filed on Dec. 20, 2017, the disclosure of which is incorporated by reference herein in its entirety.

BACKGROUND

Technical Field

The present disclosure relates to a solar cell module.

Related Art

Conventionally, a solar cell module has been proposed in which a sealing layer that seals solar cells is sandwiched between a front surface layer, which is positioned at a light-receiving surface side, and a rear surface layer, which is positioned at a rear surface side. When this type of solar cell module is used as a roof of a vehicle, a solar cell module that is formed from resin is used in order to reduce weight. When an antenna is provided in this type of vehicle roof, in order to prevent the solar cell module from electromagnetically interfering with the antenna, it is necessary to separate the antenna from the solar cell module by a predetermined distance.

Accordingly, an area of the vehicle roof where the solar cell module is provided is formed from a resin panel (i.e., a solar cell module), while an area thereof where the antenna is disposed (i.e., where the solar cell module is not provided) is formed from a metal panel (Japanese Unexamined Patent Application (JP-A) No. 2012-232679).

SUMMARY

However, because a portion of a vehicle roof is formed by a solar cell module (i.e. resin), while remaining portions are formed by a metal panel, there is an increase in the number of parts used to form this roof. Accordingly, there is room for improvement from the standpoint of reducing the number of parts used to form a roof.

Moreover, if the area of a roof where an antenna is installed is formed from resin, this may also lead to a reduction in the vehicle body weight.

The present disclosure was conceived in consideration of the above-described circumstances, and provides a solar cell module that is used in a vehicle roof in which an antenna is installed, and that achieves both a reduction in weight and a reduction in the number of parts.

A solar cell module of a first aspect of the present disclosure is provided with a sealing layer in which power generating elements are sealed, a front surface layer formed from resin and joined to a light-receiving surface side of the power generating elements in the sealing layer, and a rear surface layer joined to an opposite side from the light-receiving surface side of the power generating elements in the sealing layer, and the front surface layer has a solar cell installation area that forms a portion of a solar cell, and an antenna installation area that extends at a vehicle front side or a vehicle rear side of the solar cell installation area.

According to this structure, because an antenna installation area is provided at a vehicle front side or a vehicle rear side of the solar cell installation area that forms a portion of a solar cell, the roof of the vehicle can be formed exclusively by a solar cell module. In other words, the roof of a vehicle in which an antenna is installed can be formed by a solar cell module, so that the number of parts used to form the roof can be reduced.

Moreover, because the antenna installation area is formed at the vehicle front side or the vehicle rear side of the solar cell installation area of the front surface layer, and the sealing layer and the rear surface layer are laminated together at the vehicle lower side at the solar cell installation area of the front surface layer, the antenna that is disposed in the antenna installation area and the solar cell that is provided in the solar cell installation area are separated by a predetermined distance, and it is possible to prevent or inhibit the solar cell from generating electromagnetic interference in the antenna.

Note that the solar cell installation area of the front surface layer is not only a solar cell formation portion where the sealing layer or the rear surface layer are laminated to the vehicle lower side of the front surface layer, and includes peripheral edge portions that are formed exclusively by the front surface layer so as to surround a solar cell formation portion when looked at in plan view. These peripheral edge portions are portions that are provided to enable the solar cell formation portion to be joined to vehicle frame components. Accordingly, in the front surface layer, areas located at the vehicle front side or the vehicle rear side of the peripheral edge portions of the solar cell installation area form the antenna installation area.

A solar cell module of a second aspect of the present disclosure is the solar cell module of the first aspect, wherein an insertion hole, through which an antenna rod is inserted, is formed at the antenna installation area.

According to this structure, it is possible to install an antenna rod from a vehicle cabin side such that it protrudes above a roof via an insertion hole that is formed at an antenna installation area of a solar cell module. Because the antenna installation area is set at the vehicle front side or the vehicle rear side of the solar cell installation area of the front surface layer, an antenna (i.e., a rod) can be sufficiently separated from the solar cell, and any electromagnetic interference from the solar cell can be prevented or inhibited.

A solar cell module of a third aspect of the present disclosure is the solar cell module of the first aspect, wherein the sealing layer and the rear surface layer are not provided at a vehicle lower side of the front surface layer in the antenna installation area, so that the antenna installation area is formed exclusively by the front surface layer.

Because the solar cell module of the first aspect has the above-described structure, the number of parts used to form a vehicle roof can be reduced at the same time as a reduction in the weight of the vehicle roof is achieved.

Because the solar cell module of the second aspect has the above-described structure, it is possible to prevent or inhibit the solar cell from electromagnetically interfering with the antenna.

Because the solar cell module of the third aspect has the above-described structure, a roof of a vehicle can be formed exclusively by a solar cell module.

BRIEF DESCRIPTION OF THE DRAWINGS

Preferred embodiments will be described in detail based on the following figures, wherein:

FIG. 4 is a cross-sectional view across a line A-A shown in FIG. 2.

DETAILED DESCRIPTION

A solar cell module according to an exemplary embodiment of the present disclosure will now be described with reference to FIG. 1 through FIG. 4. Note that the solar cell module according to the present exemplary embodiment is mounted as a vehicle body roof on a vehicle frame component. Moreover, each drawing is a schematic view, and structure that has little or no relation to the present disclosure has been omitted from the drawings. Furthermore, an arrow FR, an arrow W, and an arrow UP that are shown in FIG. 1 respectively indicate a vehicle forward direction, a vehicle width direction, and a vehicle upward direction.

(Structure)

Figure 1:
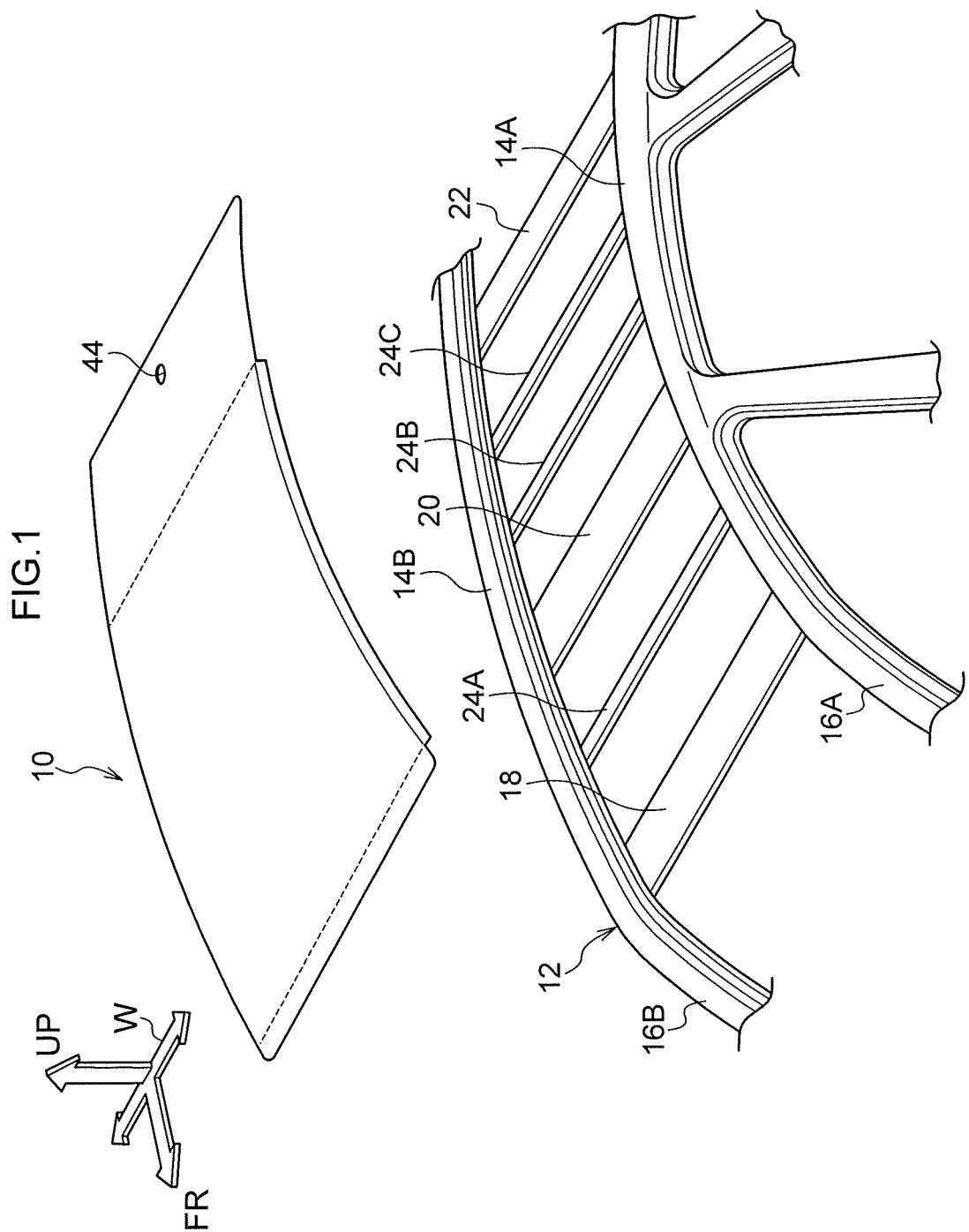
FIG. 1 is an exploded perspective view illustrating a state in which a solar cell module according to an exemplary embodiment is mounted on a vehicle body.

As is shown in FIG. 1, a vehicle solar call module 10 according to the present exemplary embodiment is mounted as a roof on a vehicle body 12. A pair of roof side rails 14A and 14B are provided extending in the vehicle front-rear direction at both end portions in the vehicle width direction of the vehicle body 12 as components that support the solar cell module 10. The roof side rails 14A and 14B are formed integrally with front pillars 16A and 16B, and the like.

A front header 18, a roof center reinforcement (hereinafter, referred to as a 'center R/F') 20, and a rear header 22 that extend in the vehicle width direction are provided in that sequence from the vehicle front side between the roof side rails 14A and 14B. Additionally, roof dent reinforcements (hereinafter, referred to as 'roof dent R/F') 24A-24C are provided such that one roof dent reinforcement 24A is provided between the front header 18 and the center R/F 20, and two roof dent reinforcements 24B and 24C are provided between the center R/F 20 and the rear header 22.

Note that the solar cell module 10 according to the present exemplary embodiment is joined (i.e., fixed) by means of a front surface layer 30 (described below) to the roof side rails 14A and 14B, the front header 18, and the rear header 22, which are vehicle frame components.

Figure 2:
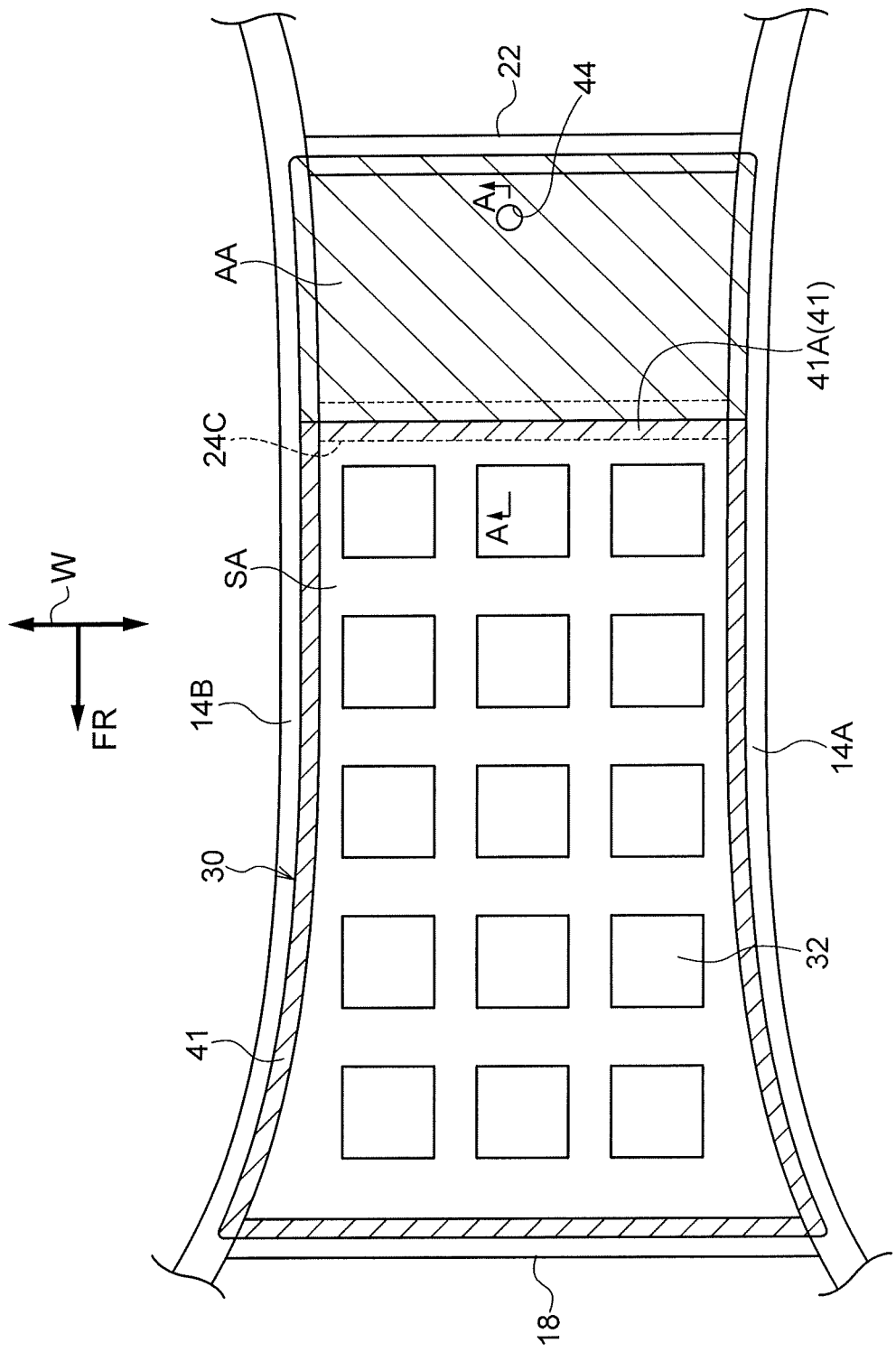
FIG. 2 is a plan view illustrating a state in which a solar cell module according to an exemplary embodiment is mounted on a roof of a vehicle body.
Figure 3:
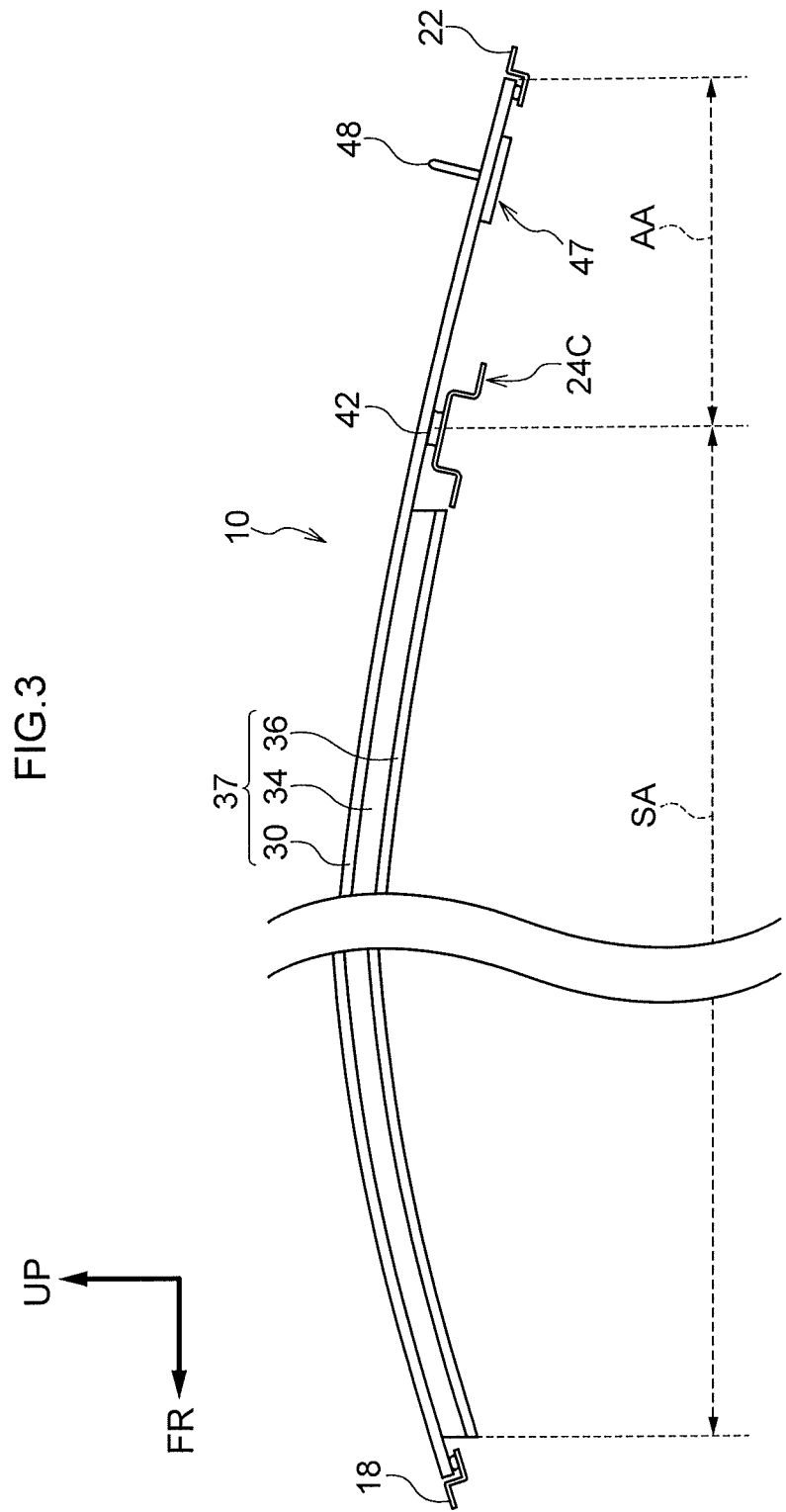
FIG. 3 is a schematic side view of a solar cell module according to an exemplary embodiment.

As is shown in FIG. 3, the front surface layer 30 is formed at the vehicle uppermost side of the solar cell module 10. As is shown in FIG. 2, the front surface layer 30 is formed by a substantially rectangular resin plate that corresponds to a shape enclosed by the roof side rails 14A and 14B, the front header 18, and the rear header 22. This resin plate is formed from transparent and extremely weather-resistant polycarbonate (PC). Because a resin plate that is made from polycarbonate (i.e., a PC plate) is lightweight as well as being extremely weather-resistant, it is extremely suited to being used for the front surface layer 30 of the solar cell module 10 that is mounted on a vehicle. Note that in the present exemplary embodiment, the term 'resin' refers to transparent resin.

As is shown in FIG. 2 and FIG. 3, an area of the front surface layer 30 from the front header 18 to the roof dent R/F 24C forms a solar cell installation area SA, while an area thereof from the roof dent R/F 24C to the rear header 22 forms an antenna installation area AA.

As is shown in FIG. 3 and FIG. 4, a solar cell 37 is formed at the vehicle lower side of the solar cell installation area SA. The solar cell 37 is formed by laminating together a sealing layer 34 that is disposed at a rear surface side of the front surface layer 30 and in which are sealed power generating elements (i.e., solar cells) 32, and a rear surface layer 36 that supports the sealing layer 34 from a rear surface side thereof. In other words, the solar cell 37 is formed by laminating the front surface layer 30 onto the sealing layer 34 at the light-receiving surface side of the power generating elements 32, and laminating the rear surface layer 36 onto the sealing layer 34 at the opposite side from the light-receiving surface side of the power generating elements 32. Note that in the present exemplary embodiment, a structure formed by laminating together the front surface layer 30, the sealing layer 34, and the rear surface layer 36 is referred to as the 'solar cell 37'.

As is shown in FIG. 2 and FIG. 4, the sealing layer 34 is formed by plural power generating elements 32, and by a sealing material 38 that seals the power generating elements 32. The plural power generating elements 32 are arranged in a systematic pattern within the sealing layer 34, and are then sealed by the sealing material 38. The power generating elements 32 are known power generating elements such as silicon-based cells or the like. The sealing material 38 is formed as a film by mixing a silane coupling agent into an ethylene-vinyl acetate copolymer (EVA) that is transparent and has elasticity and adhesiveness.

The rear surface layer 36 is formed by a rear surface plate. The rear surface plate is formed from the same PC as the front surface layer 30 in order to prevent any buckling of the solar cell module 10 that might be caused by using PC for the front surface layer 30. As is shown in FIG. 4, the rear surface layer 36 has a substantially uniform plate thickness, however, a protruding portion 40 that is formed so as to protrude towards the vehicle upper side (i.e., towards the front surface layer 30 side) is formed around an outer periphery of end portions on a vehicle outer side of the rear surface layer 36.

As is shown in FIG. 4, an end portion of the rear surface layer 36 in the direction in which the front surface layer 30 extends is located at the vehicle outer side of an end portion of the sealing layer 34. As a result, the protruding portion 40 that is formed at the end portions on the vehicle outer side of the rear surface layer 36 protrudes towards the vehicle upper side at the vehicle outer side of the sealing layer 34, and abuts against a lower surface of the front surface layer 30. In addition, an inner surface of the protruding portion 40 abuts against an outer side end portion of the sealing layer 34.

In other words, an upper surface and an inner surface of the rear surface layer 36 are joined to the sealing layer 34, and an upper end of the protruding portion 40 is joined to the lower surface of the front surface layer 30.

Note that, in the solar cell installation area SA of the front surface layer 30, a peripheral edge portion 41 (i.e., a hatched portion in FIG. 2) that is located at a vehicle outer side (i.e., at the vehicle front side and the outer sides in the vehicle width direction) of the protruding portion 40 of the rear surface layer 36 is joined to the front header 18 and the roof side rails 14A and 14B, which are vehicle frame components. In contrast, as is shown in FIG. 4, a peripheral edge portion 41A that is located at the vehicle rear side is supported via a rubber cushioning material 42 on the roof dent R/F 24C.

On the other hand, as is shown in FIG. 2 through FIG. 4, the antenna installation area AA is formed at the front surface layer 30 at the vehicle rear side of the solar cell installation area SA. The antenna installation area AA refers to a range in the vehicle front-rear direction of the front surface layer 30 extending from the roof dent R/F 24C to the rear header 22. In the antenna installation area AA, the sealing layer 34 and the rear surface layer 36 are not provided at the vehicle lower side of the front surface layer 30, and this antenna installation area AA is formed exclusively by the front surface layer 30. An insertion hole 44 is formed substantially in the center in the vehicle width direction and at the vehicle rear side when looked at in plan view in the antenna installation area AA. An antenna rod 48 of an antenna 47 to which is attached a bush 46 is fitted into this insertion hole 44. As a consequence, the antenna rod 48 is installed such that it protrudes in the vehicle upward direction (i.e. to the vehicle exterior) from the front surface layer 30.

(Actions)

Actions of the solar cell module 10 having the above-described structure will now be described.

Because the solar cell installation area SA, which is where the sealing layer 24 and the rear surface layer 36 are laminated to the front surface layer 30 so as to form the solar cell 37, and the antenna installation area AA, which extends on the vehicle rear side of the solar cell installation area SA, are formed in the solar cell module 10, the entire roof can be formed by the resin solar cell module 10. Accordingly, compared with when the antenna installation area AA is formed by a metal panel, a reduction in the weight of the roof of a vehicle can be achieved. Additionally, the number of parts used to form the vehicle roof can also be reduced.

In particular, it is necessary for the antenna installation area to be separated by a predetermined distance from the solar cell 37 in order to avoid any electromagnetic interference from the solar cell 37. In the solar cell 10, by laminating the sealing layer 24 and the rear surface layer 36 at the vehicle lower side of the front surface layer 30 so as to form the solar cell 37 at the solar cell installation area SA, and by installing the antenna rod 48 in the antenna installation area AA in which only the front surface layer 30 extends on the vehicle rear side of the solar cell installation area SA, the solar cell 37 and the antenna 47 are separated by a predetermined distance on top of the roof (i.e., the front surface layer 30). As a result, it is possible to prevent or inhibit electromagnetic interference being generated in the antenna 47 by the solar cell 37.

Note that, in the present exemplary embodiment, the antenna installation area AA is formed at the vehicle rear side of the solar cell installation area SA in the front surface layer 30 of the solar cell module 10, however, it is also possible for the antenna installation area AA to be formed at the vehicle front side of the solar cell installation area SA.

Moreover, in order to further inhibit electromagnetic interference, it is also possible to employ a structure in which the vicinity of the antenna is surrounded by some type of metal, for example, a structure in which an inner circumferential surface of the insertion hole 44 in the antenna installation area AA is enclosed by a type of metal.

Furthermore, in the present exemplary embodiment, each one of the front surface layer 30, the sealing layer 34, and the rear surface layer 36 of the solar cell module 10 is formed from resin, however, it is also possible to employ a structure in which only the front surface layer 30 at least is formed from resin.

Moreover, in the present exemplary embodiment, the insertion hole 44 is formed substantially in the center in the vehicle width direction and on the vehicle rear side at the antenna installation area AA, however, provided that the position is one that enables electromagnetic interference to the antenna 47 to be prevented or inhibited, then the insertion hole 44 may be installed in an optional position at the antenna installation area AA.

What is claimed is:

1. A solar cell module comprising:
    a sealing layer in which power generating elements are sealed;
    a front surface layer formed from resin and joined to a light-receiving surface side of the power generating elements in the sealing layer; and
    a rear surface layer joined to an opposite side from the light-receiving surface side of the power generating elements in the sealing layer, the rear surface layer including a protruding portion that extends upwards to abut a lower surface of the front surface layer,
    wherein an end surface of the sealing layer abuts an inner surface of the protruding portion,
    wherein a front end in a length direction of the solar cell module of the lower surface of the front surface layer is configured to be supported by a first vehicle header,
    wherein a rear end in the length direction of the solar cell module of the lower surface of the front surface layer is configured to be supported by a second vehicle header,
    wherein an intermediate position in a length direction of the solar cell module of the lower surface of the front surface layer is configured to be supported by a vehicle roof reinforcement,
    wherein the protruding portion is separated from the intermediate position by a predetermined peripheral edge portion in the length direction of the solar cell module, and
    wherein the front surface layer has a solar cell installation area that extends between the front end and the intermediate position to form a portion of a solar cell, and an antenna installation area that extends from the intermediate position to the rear end.

2. The solar cell module according to claim 1, wherein an insertion hole, through which an antenna rod is inserted, is formed at the antenna installation area.

3. The solar cell module according to claim 1, wherein the sealing layer and the rear surface layer are not provided at a vehicle lower side of the front surface layer in the antenna installation area, so that the antenna installation area is formed exclusively by the front surface layer.

4. The solar cell module according to claim 1,
    wherein the protruding portion extends between opposite sides of the solar cell module in a width direction of the solar cell module, and
    wherein the antenna installation area is rearward of the protruding portion in the length direction of the solar cell module.

* * * * *